(12) United States Patent
Danilov et al.

(10) Patent No.: US 10,572,173 B2
(45) Date of Patent: Feb. 25, 2020

(54) DATA MANAGEMENT IN AN ELASTIC CLOUD STORAGE ENVIRONMENT

(71) Applicant: EMC IP Holding Company LLC, Hopkinton, MA (US)

(72) Inventors: Mikhail Danilov, Saint Petersburg (RU); Grigorii Skripko, Seattle, WA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 48 days.

(21) Appl. No.: 16/030,976

(22) Filed: Jul. 10, 2018

(65) Prior Publication Data

US 2020/0019332 A1 Jan. 16, 2020

(51) Int. Cl.
| | |
|---|---|
| H03M 13/00 | (2006.01) |
| G06F 3/06 | (2006.01) |
| H04L 29/08 | (2006.01) |
| H03M 13/15 | (2006.01) |
| G06F 11/10 | (2006.01) |

(52) U.S. Cl.
CPC .......... *G06F 3/0644* (2013.01); *G06F 3/0604* (2013.01); *G06F 3/067* (2013.01); *G06F 11/1076* (2013.01); *H03M 13/154* (2013.01); *H04L 67/1097* (2013.01); *H04L 67/2842* (2013.01)

(58) Field of Classification Search
CPC ...... G06F 3/0644; G06F 3/0604; G06F 3/067; G06F 11/1076; H03M 13/154
See application file for complete search history.

(56) References Cited

U.S. PATENT DOCUMENTS

| | | | | |
|---|---|---|---|---|
| 6,070,003 | A * | 5/2000 | Gove | G06F 15/17375 710/317 |
| 6,550,035 | B1 * | 4/2003 | Okita | H03M 13/15 714/774 |
| 7,449,110 | B2 * | 11/2008 | Sugiura | B01D 63/061 210/321.78 |
| 7,559,007 | B1 * | 7/2009 | Wilkie | H03M 13/1515 714/790 |
| 7,581,156 | B2 * | 8/2009 | Manasse | H03M 13/1515 714/781 |
| 8,799,746 | B2 * | 8/2014 | Baker | G06F 11/10 714/769 |
| 8,935,221 | B1 * | 1/2015 | Lazier | G06F 11/14 707/690 |
| 9,983,959 | B2 * | 5/2018 | Jenkins, Jr. | G06F 11/1076 |
| 2012/0060072 | A1 * | 3/2012 | Simitci | H03M 13/373 714/756 |
| 2013/0080862 | A1 * | 3/2013 | Bennett | G06F 11/1076 714/782 |
| 2014/0351486 | A1 * | 11/2014 | Baryudin | G06F 3/0619 711/103 |
| 2018/0300346 | A1 * | 10/2018 | Eda | G06F 16/128 |

* cited by examiner

*Primary Examiner* — Esaw T Abraham
(74) *Attorney, Agent, or Firm* — Amin, Turocy & Watson, LLP

(57) ABSTRACT

Elastic cloud storage (ECS) systems typically divide storage nodes into geographic or topological zones and implement various concepts that enable the system to be extremely efficient in terms of capacity management. Architectures detailed herein can improve ECS and other similar systems in terms of inter-zone data transfers and remote data caching without violating core concepts of an ECS system that enable efficient capacity management.

20 Claims, 10 Drawing Sheets

DATA MANAGEMENT IN AN ELASTIC CLOUD STORAGE ENVIRONMENT

TECHNICAL FIELD

The present application relates generally to data management techniques in an elastic cloud storage environment including techniques for requesting remote data and locally caching the requested remote data.

BACKGROUND

Elastic cloud storage (ECS) represents a recent development in cloud services. ECS supports geographically disperse implementations consisting of two or more zones. From the perspective of one of the zones, data can be local (e.g., owned by the local zone) or remote (e.g., owned by a remote zone). ECS can implement a local cache that can store some portions of remote data. Provided the desired remote data is currently stored in the local cache, a request for remote data can be satisfied locally without transferring the requested data from a remote zone.

BRIEF DESCRIPTION OF THE DRAWINGS

Numerous aspects, embodiments, objects, and advantages of the present invention will be apparent upon consideration of the following detailed description, taken in conjunction with the accompanying drawings, in which like reference characters refer to like parts throughout, and in which.

DETAILED DESCRIPTION

Overview

Figure 1:
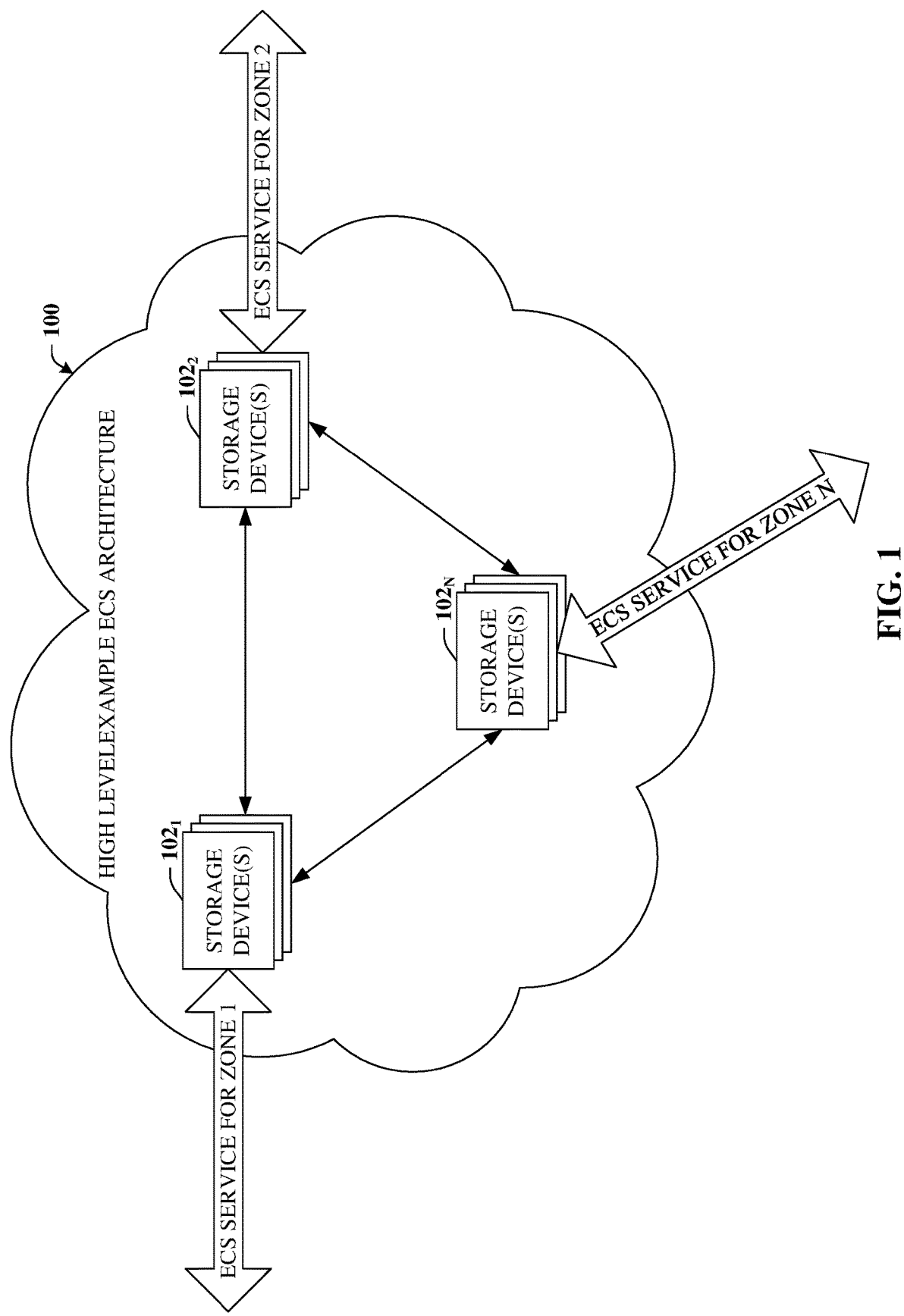
FIG. 1 illustrates at a high level an example ECS architecture in accordance with certain embodiments of this disclosure.

The disclosed subject matter is now described with reference to the drawings, wherein like reference numerals are used to refer to like elements throughout. In the following description, for purposes of explanation, numerous specific details are set forth in order to provide a thorough understanding of the disclosed subject matter. It may be evident, however, that the disclosed subject matter may be practiced without these specific details. In other instances, well-known structures and devices are shown in block diagram form in order to facilitate describing the disclosed subject matter.

FIG. 1 illustrates at a high level an example ECS architecture 100 in accordance with certain embodiments of this disclosure. In this example, three geographically disparate zones are depicted, with each zone comprising respective storage device(s) 102. For example, storage devices $102_1$ can provide ECS services to clients of zone 1, storage devices $102_2$ can provide services for zone 2, and storage devices $102_N$ can provide services in zone N, wherein N can be any suitable positive integer. It is understood that the reference numerals used herein can be employed to refer to elements, either collectively or individually, with appropriate subscripts employed generally only when useful or convenient to highlight various distinctions or to better impart the disclosed concepts.

ECS systems can maintain a global namespace and assure strong consistency for user data (e.g., client objects). Such can be achieved by defining a primary zone for each object. As one example, the primary zone can be the zone that created or added the client object to the ECS system. Typically, requests relating to a given object are handled by the primary zone. Thus, suppose a client accesses ECS services by interfacing with the ECS system at zone 1. For example, suppose a client attempts to read a client object stored and protected by the ECS system. If the object is locally owned, then that object resides locally (e.g., at zone 1 and/or at storage devices $102_1$), and the request can be handled exclusively by devices at zone 1, which can be efficient.

On the other hand, if the client object is not locally owned, then satisfying the request can be less efficient or more expensive in terms of resource-utilization of the ECS system. For example, if the client object is owned by and/or resides at one of the (remote) storage devices $102_2$, $102_N$, etc., then the appropriate data may need to be transferred from a remote zone to the local zone in order to satisfy the client request, which can be more expensive or less efficient.

It is observed that a zone geographically nearest to a client at the time a client object is added to the system is likely to be the primary zone for that client object. A given local zone of an ECS system with N zones therefore has a statistical probability of 1/N of being the primary zone for a given client object. Correspondingly, one of the remote zones is the primary zone for a client object with statistical probability of (N−1)/N. Thus, all else being equal, only about 1 out of every N requests are likely to be satisfied without an inter-zone data transfer.

In an effort to mitigate inter-zone data transfers, each zone can maintain a local cache to store portions of remote data, which is further detailed in connection with FIG. 2 and subsequent drawings. For example, storage devices $102_1$ may reserve some portion (e.g., ~5%) of capacity for remote data. Data maintained in this local cache can be based on a most recently used policy, a most frequently used policy, or some other suitable policy. Regardless, if the client object being requested is not locally owned, then there is still a chance that the requested data exists in the local cache. If so, then the request can be satisfied without an inter-zone transfer.

However, efficacy of the local cache has been found to be quite low. For example, based on observations, it has been determined that the likelihood of a client object owned by a remote zone being in the local cache of a local zone that receives a request (e.g., read request) for the client object, is only about 1.5%. That is, implementing a local cache only mitigates inter-zone transfers about 1.5% of the time. While changing the various policies relating to which data is or is not retained in the cache can affect that value, efficiency of the local cache remains low.

Techniques detailed herein can significantly improve the efficacy of the local cache, which can represent a substantial improvement in cloud-based services such as how data is stored in cloud-based ECS systems or similar systems. In that regard, it is observed that one of the reasons for such inefficient use of the local cache relates to the way ECS data is stored and protected, which is further detailed in connection with FIG. 2.

Figure 2:
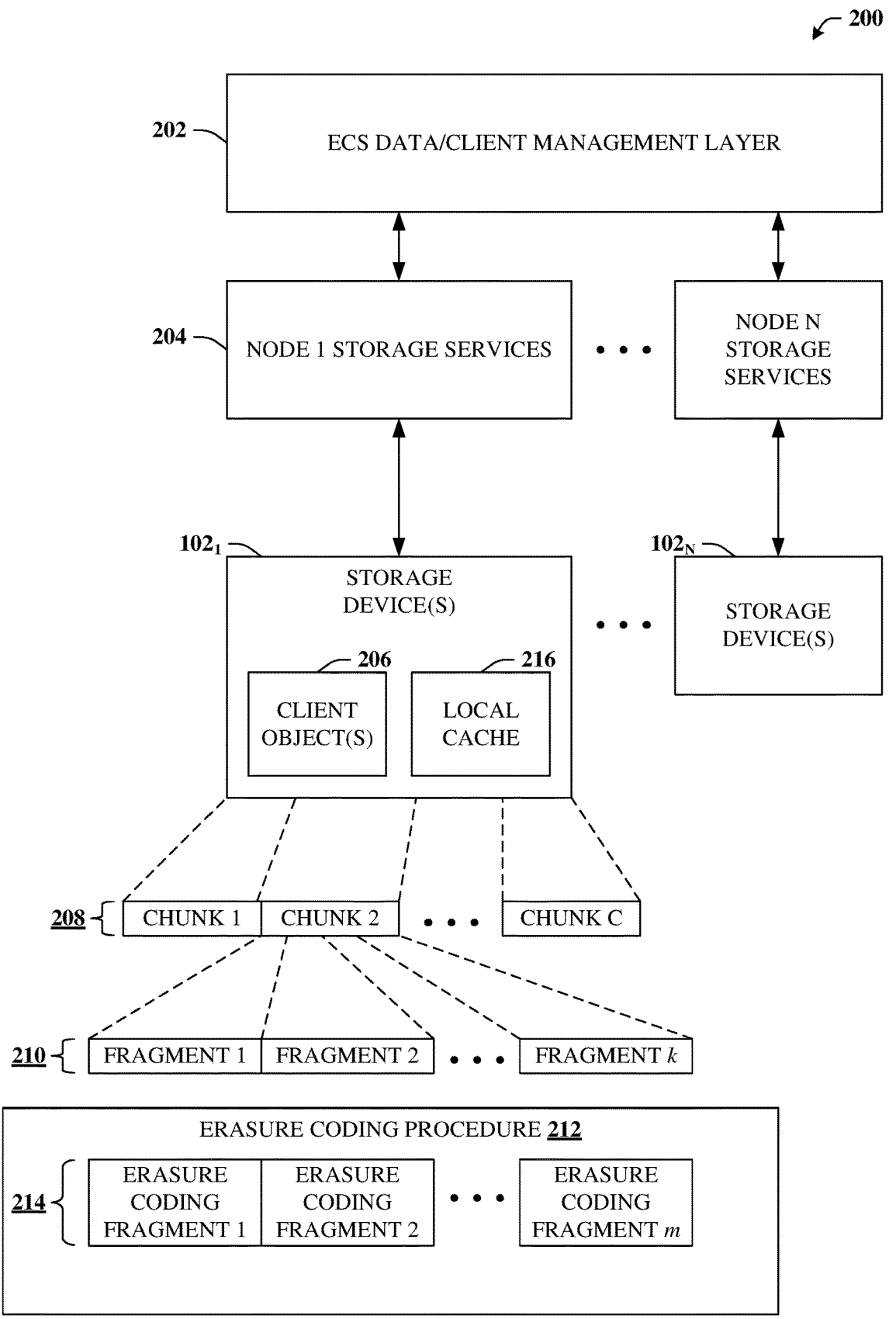
FIG. 2 depicts a block diagram representing a lower level ECS architecture focusing on a single node or zone in accordance with certain embodiments of this disclosure.

While still referring to FIG. 1, but turning now as well to FIG. 2, system 200 is depicted. System 200 is a block diagram representing a lower level ECS architecture focusing on a single node or zone in accordance with certain embodiments of this disclosure. For example, an ECS cluster can contain ECS data/client management layer 202 that can facilitate data or client management for multiple nodes or zones of the ECS system. For instance, ECS data/client management layer 202 can exist on top of storage services applications such as node 1 storage services 204 that manages or handles storage services for the group of storage devices of node 1/zone 1 (e.g., storage devices $102_1$). As one example implementation, a single node (e.g., zone 1) of ECS can run on a hardware appliance cabled or otherwise operatively coupled to between about 15 to about 120 storage devices $102_1$, which store respective ECS data as client objects 206.

A single ECS node can run a number of services. For instance, in some implementations, an ECS node can manage about 20 independent services. Some of these services can be cluster-level services (e.g., handled by ECS data/client management layer 202). In some embodiments, ECS systems can apply a flat cluster principle, where all cluster-level functions are distributed relatively evenly between all cluster nodes. In that regard, it is not guaranteed that a service that runs on some node owns data locations on storage devices 102 of that particular node. Some other node or nodes may own these data locations.

Significantly, ECS does not typically employ traditional data protection schemes such as mirroring or parity protection. Rather, ECS or other similar systems generally use an erasure coding approach, which is further detailed in connection with FIG. 5. Erasure coding schemes can be advantageous in view of the fact that ECS systems generally do not rely on a conventional file system to identify individual files, but rather partition all or a subset of ECS data in blocks of a fixed size referred to herein as chunks 208.

For example, each of the storage devices (e.g., hard drives) 102 of zone 1 and other zones can be partitioned into an appropriate number of chunks 208. For example, a given storage device $102_1$ can be partitioned into some number, C, chunks 208, depending on capacity. As one example, the fixed size of a chunk 208 can be about 128 megabytes (MB), but other sizes are contemplated and can be readily observed to be within the scope of this disclosure. All or some relevant portion of ECS data is stored in chunks 208. As user data (e.g., client objects 206) are added to the ECS system, those data are allocated to an available (e.g., open) chunk 208 such that chunks 208 can be, and typically are, shared between clients. That is, a given chunk 208 can contain numerous client objects 206 from multiple different clients. In some embodiments, chunk 208 content can be modified in append-only mode, and chunks 208 filled potentially by any client of the ECS system. When a given chunk 208 becomes full enough, that chunk 208 gets sealed. Content of sealed chunks 208 can be immutable and protected using erasure coding.

Erasure coding can be performed at the chunk level as part of an erasure coding procedure 212. In that regard, a given chunk 208 of a fixed size (e.g., 128 MB) can be divided into some number, k, data fragments 210 of a fixed size (e.g., ~10 MB in the case where k=12). Some number, m, coding fragments 214 can be created. A typical implementation can employ m=4. The way the coding is done can assure that the ECS system can tolerate the loss of any m fragments 210, 214. That is, if a portion of ECS data is corrupted or one or more storage devices 102 fails, the content of a given chunk 208 can be rebuilt from the remaining k data fragments 210 and m coding fragments 214, which is further detailed below in connection with FIG. 5.

A very significant advantageous of ECS systems or other similar systems is that capacity management for the entire ECS system can be greatly simplified and the erasure coding, as well as most other services or operations, can be performed at the chunk level. While the innovative architecture of ECS can dramatically simplify capacity management, that architecture is one of the reasons use of a local cache 216 does not significantly reduce inter-zone transfers.

In existing approaches, inter-zone transfers are requested a chunk (e.g., 128 MB) at a time and local cache 216 is populated a chunk at a time. Meanwhile, it is observed that while chunks 208 have a fixed size, client objects 206 are not fixed in terms of size, but rather have a variable or arbitrary size. Thus, consider a client object 206 having a size of about 1 MB is requested by a client. Assuming that client object 206 is not locally owned and not in the local cache 216, the inter-zone transfer will transfer the entire 128 MB chunk 208 that houses the 1 MB client object 206. Such can be inefficient in two ways. First, transferring within the cloud fabric 128 MB to facilitate a 1 MB client read is very expensive in terms of resource utilization. Second, allocating the 128 MB chunk to the local cache when there is little or no evidence the other 127 MB are likely to be needed in connection with future requests can be expensive in terms of cache allocation.

The disclosed subject matter can, in some embodiments, provide a more general and more efficient mechanisms for both inter-zone transfers and populating the local cache, and can do so without violating the core principles of the ECS architecture that allow the advantageous capacity management techniques associated with ECS systems.

It is observed that, perhaps, the most straightforward way of improving the efficiency of local caching and inter-zone transfers would be to simply allow transfers and local caching to occur at the object level instead of the chunk level. However, objects have an arbitrary size so such an approach would contradict the key concepts of the ECS architecture and would add significant complexity to capacity management. For example, the use of fixed-sized chunks makes capacity management very simple. In an ECS system, there are only two possible sizes of a capacity block, chunks (e.g., 128 MB) and chunk fragments (e.g., ~10 MB) noted in connection with erasure coding procedure 212. Transition to a capacity block of an arbitrary size must make capacity management more complex and less efficient.

Moreover, content of client objects in ECS is not fixed, but rather arbitrarily varies. The fact that client objects can be updated therefore relies on more sophisticated synchronization mechanisms in some embodiments. Use of immutable (e.g., sealed) chunks mitigates many synchronization issues in ECS. However, mutable data storing in the local cache makes the task of inter-zone synchronization more complex. In other words, transition to a local cache that works at the object level would require implementation of at least one more storage engine inside ECS, which is obviously undesired.

Techniques detailed herein can, in some embodiments, represent a tradeoff between the two competing goals. Such can be aimed at increasing the efficiency of inter-zone transfers and local caching without overcomplicating the ECS architecture. For example, techniques detailed herein can maintain operation at the chunk level, however, any requirement to transfer and maintain the whole chunk in the local cache can be relaxed. Thus, rather than transferring and locally storing an entire chunk of data containing the requested client object, only the fragment(s) within the chunk containing the requested client object need be requested and stored to the cache.

Utilizing these techniques, it can be expected that a chunk (e.g., chunk 208) will normally have just one (or very few) fragment that are requested and stored to the local cache in order to acquire the requested client object. That fact alone increases the effective capacity of the local cache and reduces the inter-zone transfer efficiency by at least a factor of k (e.g., 12). Since the cache policy can be effectuated in a manner that can be k times more efficient, fewer inter-zone requests will be needed, and those that are can transfer data 1/k the size of a chunk instead of the entire chunk. Despite becoming more fine-grained, the local cache can still use one of the two standard capacity block sizes, in this case, the fixed fragment size instead of the fixed chunk size. It is observed that these techniques can preserve the ECS approach for user data addressing in immutable data blocks. These and other techniques are further detailed in connection with FIGS. 3-5. Another, potentially more efficient technique is detailed in connection with FIG. 6.

Example Systems

Figure 3:
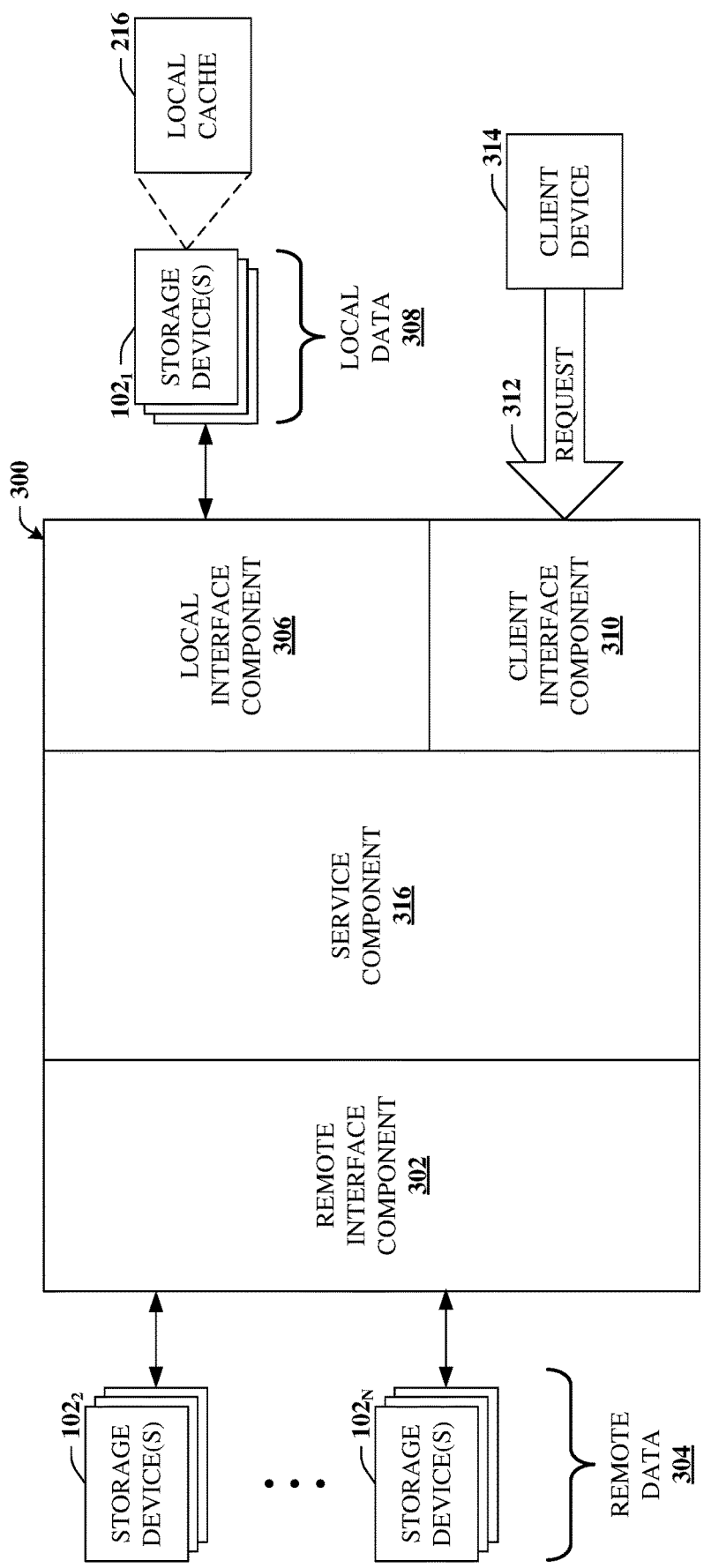
FIG. 3 depicts a block diagram of an example system that can reduce inter-zone transfers and increase local cache efficiency of an ECS system in accordance with certain embodiments of this disclosure.

Referring now to FIG. 3, a block diagram of an example system 300 is depicted. System 300 can reduce inter-zone transfers and increase local cache efficiency of an ECS system in accordance with certain embodiments of this disclosure. Generally, system 300 can comprise a processor and a memory that stores executable instructions that, when executed by the processor, facilitate performance of operations. Examples of the memory and processor can be found with reference to FIG. 10. It is to be appreciated that the computer 1002 can represent a server device or a client device and can be used in connection with implementing one or more of the systems, devices, or components shown and described in connection with FIG. 3 and other figures disclosed herein.

In some embodiments, system 300 can operate at the node or zone level of an ECS system. For example, all or a portion of system 300 can respectively reside at each one of the N zones discussed in connection with FIG. 1. System 300 can comprise remote interface component 302 that can be configured to interface with a group of remote storage devices of an ECS system, such as storage devices $102_2$-$102_N$. As detailed in connection with FIGS. 1 and 2, the ECS system can store a client object (e.g., client object 206) in a chunk (e.g., chunk 208) of a first fixed size and can protect the client object and other ECS data via an erasure coding procedure performed at the chunk level and/or performed on data contained in the chunk. For the remainder of this disclosure ECS data (e.g., data stored by the ECS system) is conceptually divided into two parts, referred to herein as remote data 304 and local data 304. Remote data 304 can be representative of data stored remotely from system 300 (e.g., in a different zone), that is, stored in first chunks of the first fixed size by the group of storage devices $102_2$-$102_N$. Local data 308 can be representative of data stored locally to system 300, that is, stored in second chunks of the first fixed size by local storage devices (e.g., storage devices $102_1$).

System 300 can further comprise local interface component 306 that can be configured to interface to the local storage devices of the ECS system, exemplified here as storage devices $102_1$. As previously detailed storage devices 102 can allocate a portion of total capacity, typically about five percent, to serve as local cache 216. Local cache 216 can be configured to store a copy of some portion of remote data 304. As noted, provided local cache 216 contains the target data, a request for remotely-owned data can be satisfied without an inter-zone transfer. For the purposes of this disclosure, content of local cache 216 is assumed to be included in local data 308, and therefore reference to local data 308 can include a copy of some portions of remote data 304.

System 300 can include client interface component 310 that can be configured to receive request 312 for the client object, which can be received from client device 314. Service component 316 can be configured to determine the chunk that stores the client object is one of the first chunks that store remote data 304. Service component 316 can further determine a fragment of the chunk that stores the client object. As discussed, the fragment can be representative of a data fragment of a second fixed size employed by the erasure coding procedure. The second fixed size of the fragment (e.g., ~10 MB) can be substantially less than the first fixed size of the chunk (e.g., 128 MB). It is noted that if the requested client object is included in local data 308, then the request can be satisfied without an inter-zone transfer. However, if, as here, the identified chunk containing the identified fragment that includes the requested client object is not found in local data 308, then an inter-zone transfer may be invoked, which is further detailed in connection with FIG. 4.

Figure 4:
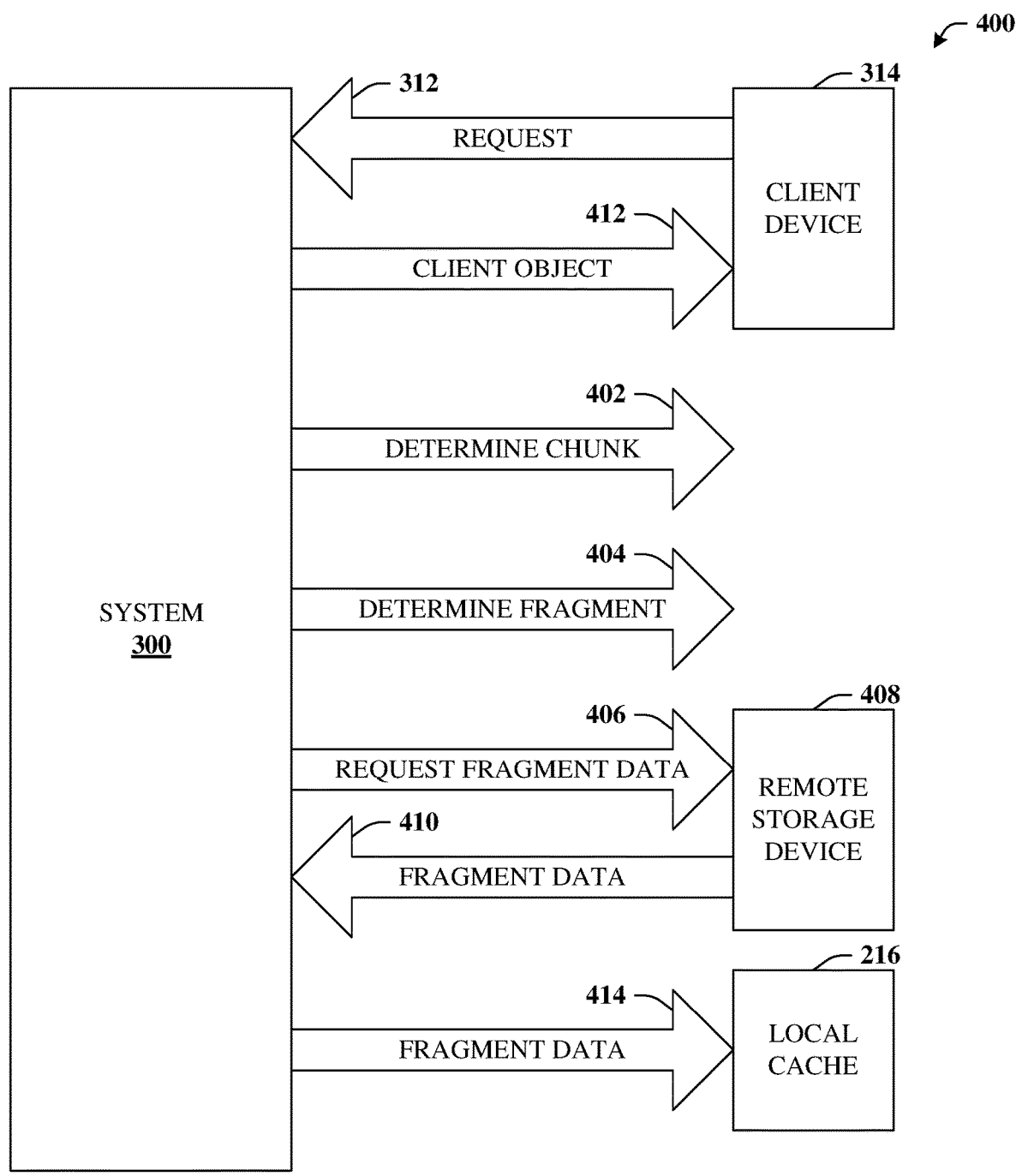
FIG. 4 illustrates a block diagram of an example system that can provide additional aspects or elements in connection with improving inter-zone transfers and local cache efficiency in accordance with certain embodiments of this disclosure.

With reference now to FIG. 4, a block diagram of an example system 400 is depicted. System 400 illustrates additional aspects or elements in connection with improving inter-zone transfers and local cache efficiency in accordance with certain embodiments of this disclosure. For example, as detailed in connection with FIG. 3, system 300 can receive, from client device 314, request 312 requesting a client object. In response, system 300 can determine the particular chunk (e.g., chunk 208) as well as the particular data fragment (e.g., fragment 210) that stores the requested client object, which is illustrated by reference numerals 402 and 404 respectively.

In some embodiments, user data such as the requested client object can be mapped to a data fragment in the following manner. An i-th data fragment can contain the following range of data from a parent chunk: $r_i=[(i-1)*S/k,$ i*S/k], where S is the first fixed size (e.g., chunk size) and k is the number of data fragments of the second fixed size in the chunk. Traditionally, i can be a value in the range of [1, k] and a byte address within the chunk can be a value in the range of [0, S]. Correspondingly, a byte of user data with an offset within the chunk of b can be found in a data fragment with the following fragment index, f:

$$f = \frac{b+1}{S/k}$$

Thus, once the chunk containing the requested client object is identified (e.g., via determination 402), the byte offset, b, within that chunk of the client object can be utilized (e.g., via determination 404) to identify the appropriate fragment, which can be the fragment with the fragment index, f.

System 300 can be configured to request fragment data, which is illustrated by request 406. For example, service component 316 can transmit, via remote client interface 302, request 406. Request 406 can request from remote storage device 408 fragment data representative of the data stored in the particular data fragment, f, which contains at least a portion of the requested client object. It is understood that while a client object will not typically span multiple chunks, the client object might span multiple fragments. In such cases, determination 404 can determine the multiple fragments that contain the client object and request 406 can request the fragment data of multiple fragments from remote storage device 408. Whether fragment data of a single or multiple fragments is requested, that fragment data can be transmitted from remote storage device 408 to system 300, as illustrated by reference numeral 410.

The client object within the fragment data can be extracted and provided to client device 314, satisfying request 312. For example, service component 316 can transmit, via client interface component 310, a portion of the fragment data containing the client object. Furthermore, depending on the policies associated with local cache 216, the fragment data can be locally cached for later access or recall. For example, service component 316 can store, via local interface component 306, the fragment data to local cache 216, which is illustrated by reference numeral 414.

It is appreciated that the above described inter-zone transfer requests data having the second fixed size (e.g., fragment size, S/k) rather than data having the first fixed size (e.g., chunk size, 5). Thus, inter-zone transfers can be significantly more efficient and/or require significantly fewer resources to effectuate. Moreover, rather than allocating an entire chunk of data to local cache 216 when locally storing this remote data 304, only a fragment size need be allocated. While it can be known that the specific client object requested satisfies a particular frequency or recently used policy associated with local cache 216, the same cannot be said for the remainder of data of that chunk, which can include client objects that are stale or otherwise not likely to be needed at the current zone at the current time, and therefore do not necessarily represent a judicious use of space in local cache 216.

By storing only the fragment data rather than the entire chunk data, local cache 216 can be significantly more efficient, e.g., by a factor of k (e.g., 12). For example, this increased efficiency can be due in part to local cache 216 effectively storing k-times more relevant data. Thus, a factor of k fewer inter-zone transfers are likely to be needed, and those inter-zone transfers that are requested can be a factor of k more efficient to accomplish. Advantageously, data in local cache 216 can still be addressed at the chunk level since the fragment data in local cache 216 can rely on the addressing of the parent chunk, and can maintain the global namespace and ensure strong data consistency. Hence, the significant performance improvements with respect to local caching and inter-zone transfers can be accomplished without disturbing the key concepts or fundamental approach of the ECS system.

Figure 5:
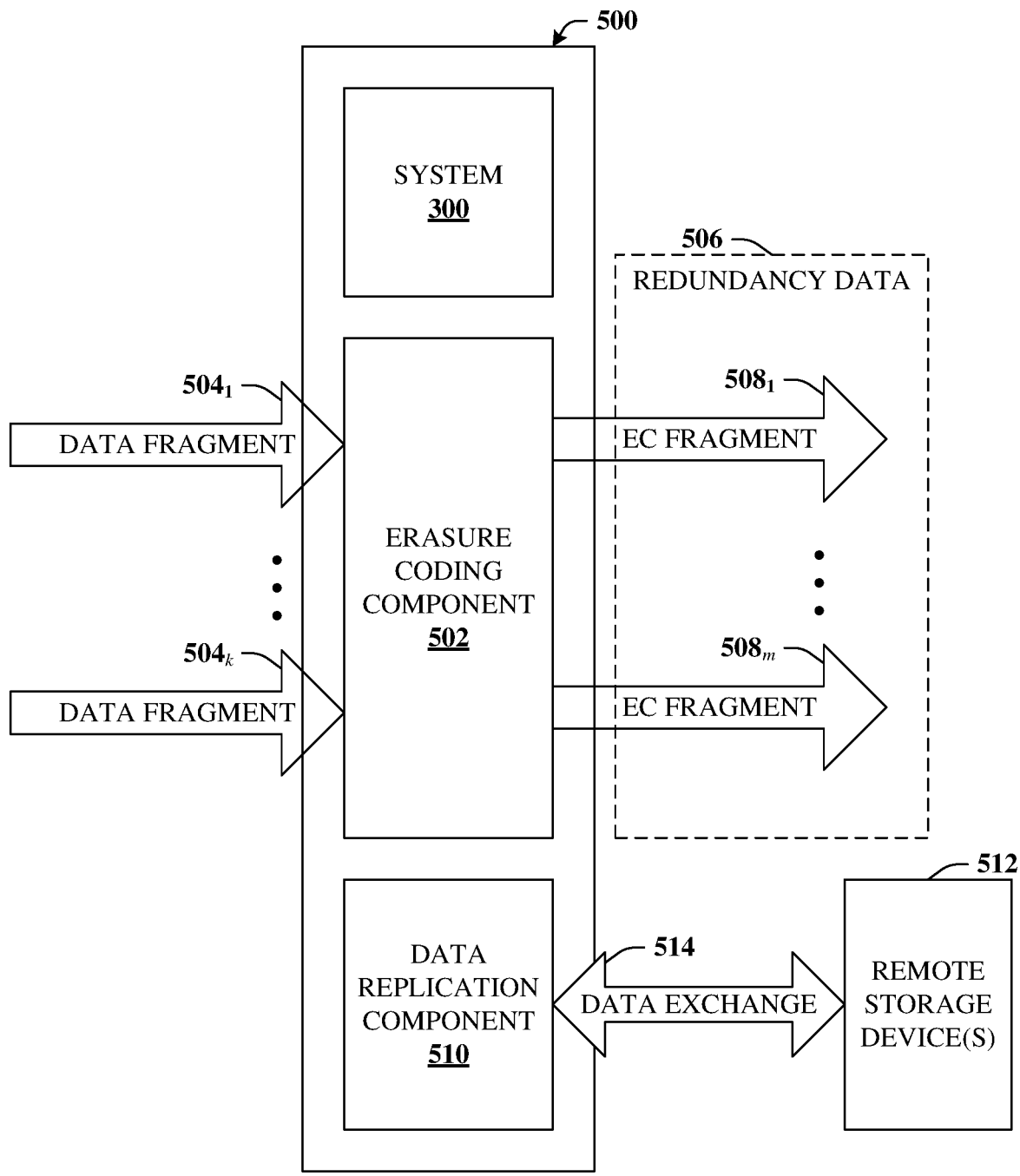
FIG. 5 illustrates a block diagram of an example system showing in more detail elements of erasure coding and data replication in accordance with certain embodiments of this disclosure.

Referring now to FIG. 5, a block diagram of an example system 500 is depicted. System 500 illustrates in more detail elements of erasure coding and data replication in accordance with certain embodiments of this disclosure. System 500 can include all or portions of system 300. In addition, system 500 can include erasure coding component 502. Erasure coding component 502 can be configured to perform an erasure coding procedure with respect to local data 308, which can be similar to erasure coding procedure 212 described more generally in the context of ECS data in connection with FIG. 2.

As with many other aspects of the ECS system, erasure coding can be performed at the chunk level. As introduced previously, a given chunk 208 of a fixed size (e.g., 128 MB) can be divided into some number, k, data fragments 210 of a fixed size (e.g., ~10 MB in the case where k=12). Some number, m, coding fragments 214 can be created. A typical implementation can employ m=4. The way the coding is done can assure that the ECS system can tolerate the loss of any m fragments 210, 214. That is, if a portion of ECS data is corrupted or one or more storage devices 102 fails, the content of a given chunk 208 can be rebuilt from the remaining k data fragments 210 and m coding fragments 214.

To illustrate, consider an example erasure coding procedure that encodes data contained in the first fragment 210 of the first sealed chunk 208 of twelve (or some other value of k) storage devices 102. Those k different data fragments are illustrated here as data fragments $504_1$-$504_k$. Such encoding can result in four (or some other value of m) fragments 214 of coded data, which are illustrated here as erasure coding (EC) fragments $508_1$-$508_m$ collectively representing redundancy data 506 generated by the erasure coding procedure. Each of these four fragments $508_1$-$508_m$ can be stored to a respective different storage device 102. One result is that the erasure coding procedure protects 16 fragments of data at a time, 12 representing client data and four representing encoding data, and each of those 16 fragments are stored to a different storage device 102. In the event of a failure of any one of those 16 storage devices 102, some subset of the remaining 15 functioning storage devices 102 can be used to rebuild the lost data.

System 500 can further include data replication component 510. Data replication component 510 can be configured to exchange portions of local data 308 and portions of remote data 304 in chunks of the fixed size. For example, copies of local data 308 can be provided to remote storage devices 512 (e.g., storage devices of remote zones) and copies of remote data 304 can be provided to storage devices of a local zone, which can be effectuated by data exchange 514. Data replication in ECS systems typically work at the chunk level such that zones produce back copies of user data by interchanging chunks with user data. Appreciably, this exchange operates at the chunk level rather than exchanging the client objects themselves in order to be consistent with ECS concepts.

Figure 6:
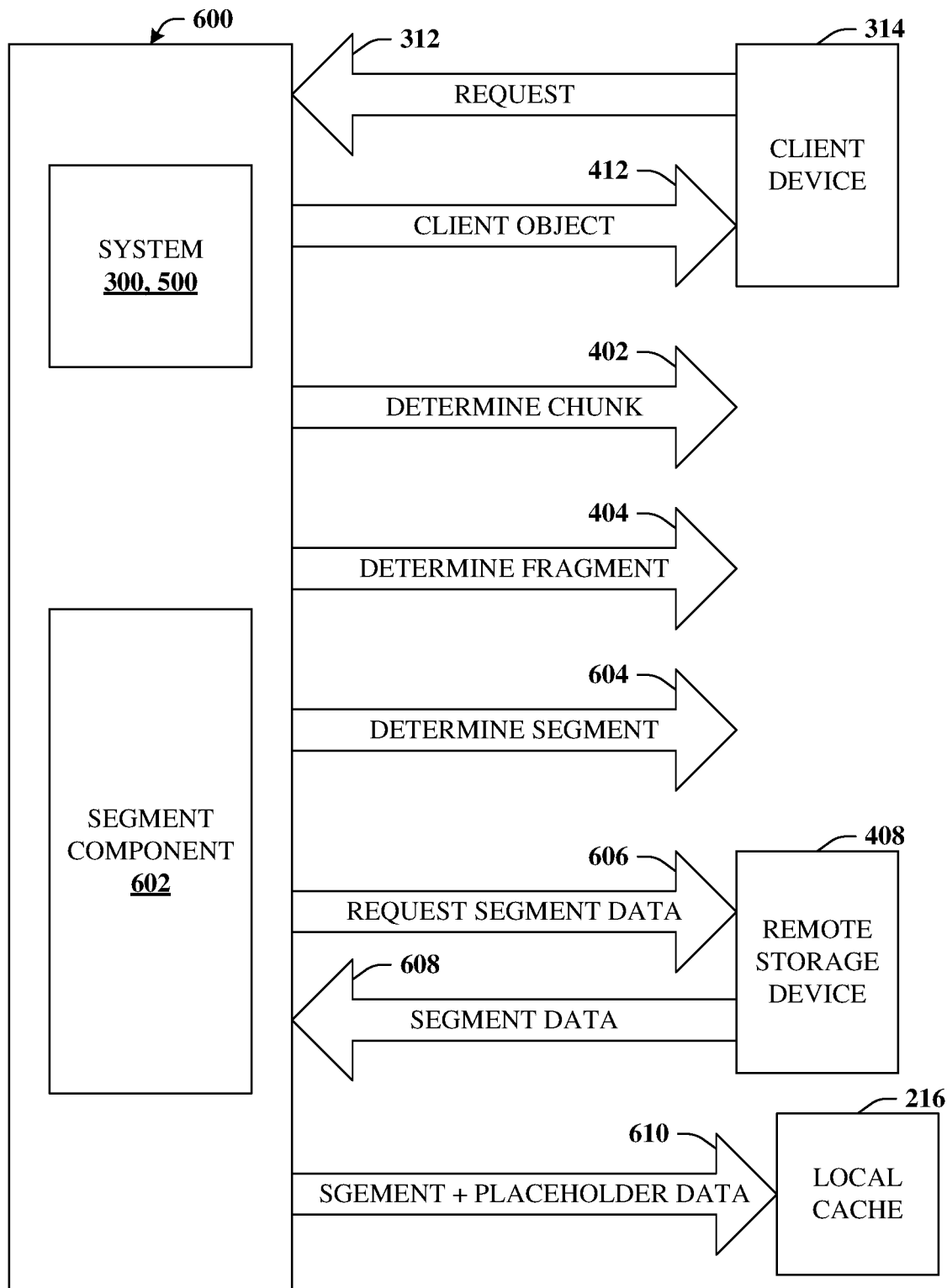
FIG. 6 illustrates a block diagram of an example system that can facilitate a segmenting technique that can potentially be more efficient for inter-zone transfers in accordance with certain embodiments of this disclosure.

Turning now to FIG. 6, a block diagram of an example system 600 is depicted. System 600 illustrates a segmenting technique that can potentially be more efficient for inter-zone transfers in accordance with certain embodiments of this disclosure. System 600 can include all or portions of system 300 and/or system 500, as detailed herein, which can, e.g., receive request 312 that requests a client object and determine the chunk and the fragment associated with the requested client object detailed in connection with reference numerals 402 and 404 of FIG. 4.

In addition, system 600 can include segment component 602. Segment component 602 can be configured to determine a segment 604, within the fragment identified by determination 404, that comprises all bytes of the requested client object. As noted previously, client objects are not fixed in size, but rather can have an arbitrary or variable size. That variable size is likely to be less than the fixed size of a fragment (e.g., the second fixed size) but regardless, the size of portions of a client object identified to reside in a particular fragment cannot exceed the second fixed size, and will typically be less, even in cases where the entire client object is greater than the second fixed size and/or cases where multiple fragments are used to store a client object.

Consider again the example introduced above in which the fragment size is ~10 MB and the client object is 1 MB, which can be a likely scenario in an ECS system. Whether the entire 1 MB of the client object is contained in a single fragment or spans multiple fragments, the amount of data of the client object is significantly less than the second fixed size of a ~10 MB fragment, and can be identified by the byte offset within the chunk, b, or by some other suitable means. Hence, rather than requesting the entire ~10 MB fragment, as detailed in connection with request 406 of FIG. 4, segment component 602 can instead request segment data, illustrated by request 606. In response, remote storage device 408 can transmit the client object stored to the identified segment without transmitting other data stored to other portions of the identified fragment, illustrated by reference numeral 608.

The client object can be provided to client device 314 to satisfy request 312. However, to maintain consistency with the ECS system, the segment data and/or the client object alone is not stored to local cache 216. Rather, segment component 602 can, via local interface 306, store data having the second fixed size (e.g., fragment size) to local cache 216. The fragment stored to local cache 216 can comprise the client object (e.g., the segment) that is appropriately offset within the fragment and the remaining portions of the fragment populated with placeholder data (e.g., zeroes), illustrated by reference numeral 610.

It can be observed that utilizing the segmenting technique can operate to reduce the amount of usable data stored by local cache 216 in that only segments of usable data are maintained rather than entire fragments. However, only the identified segment of the fragment is likely to be relevant data in the context of local cache 216 (e.g., recently/frequently used), therefore, it is not likely that the segmenting technique will significantly reduce the efficiency of local cache 216. On the other hand, the segmenting technique can further reduce, and in many cases significantly so, the size of data exchanged in connection with inter-zone transfers. For instance, in the example above, the size of the data exchanged (e.g., a 1 MB segment vs. a ~10 MB fragment) by the inter-zone transfer was reduced by an additional factor of about 10.

Example Methods

Figure 7:
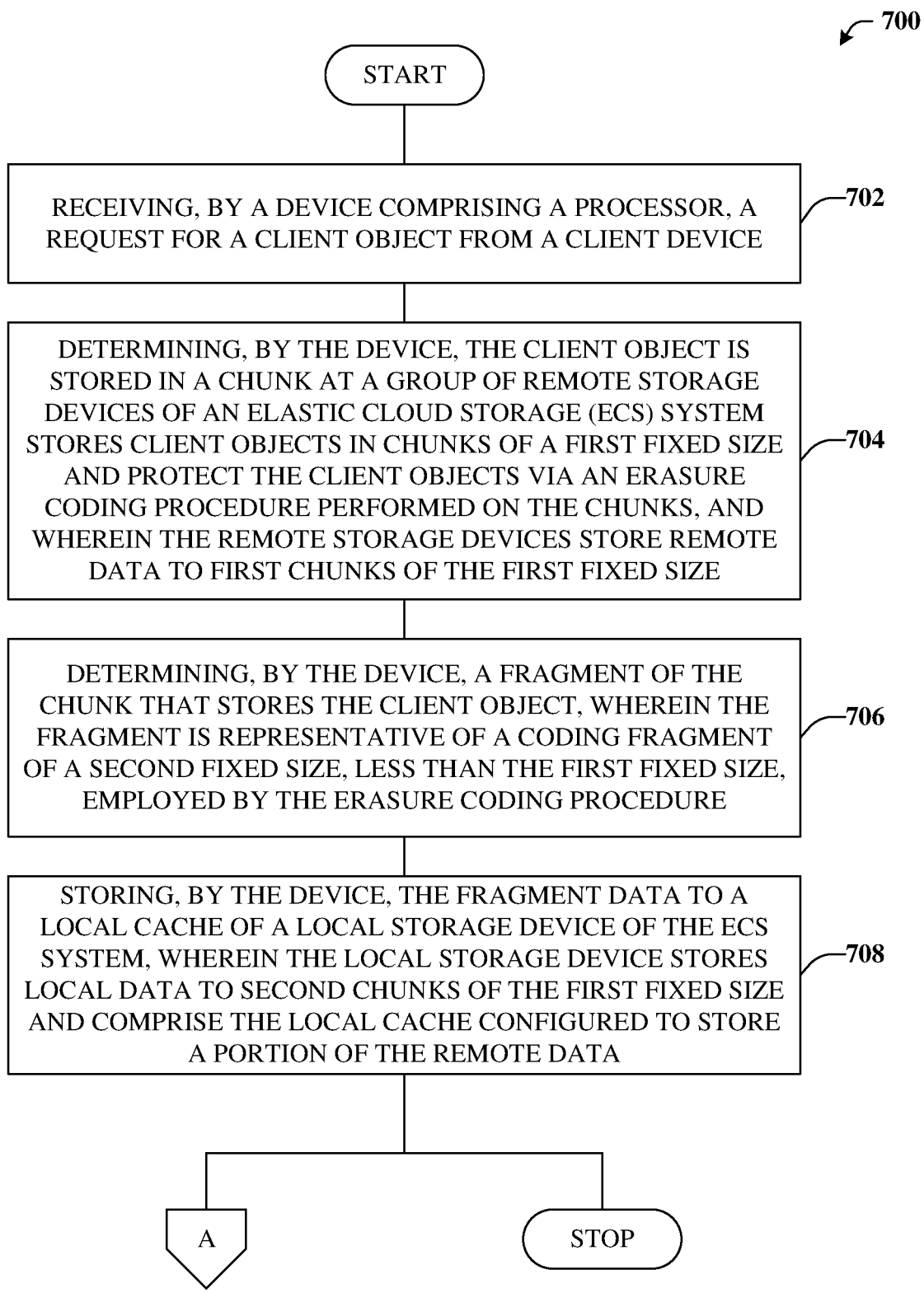
FIG. 7 illustrates an example methodology that can facilitate reduced inter-zone transfers and increased local cache efficiency of an ECS system in accordance with certain embodiments of this disclosure.
Figure 8:
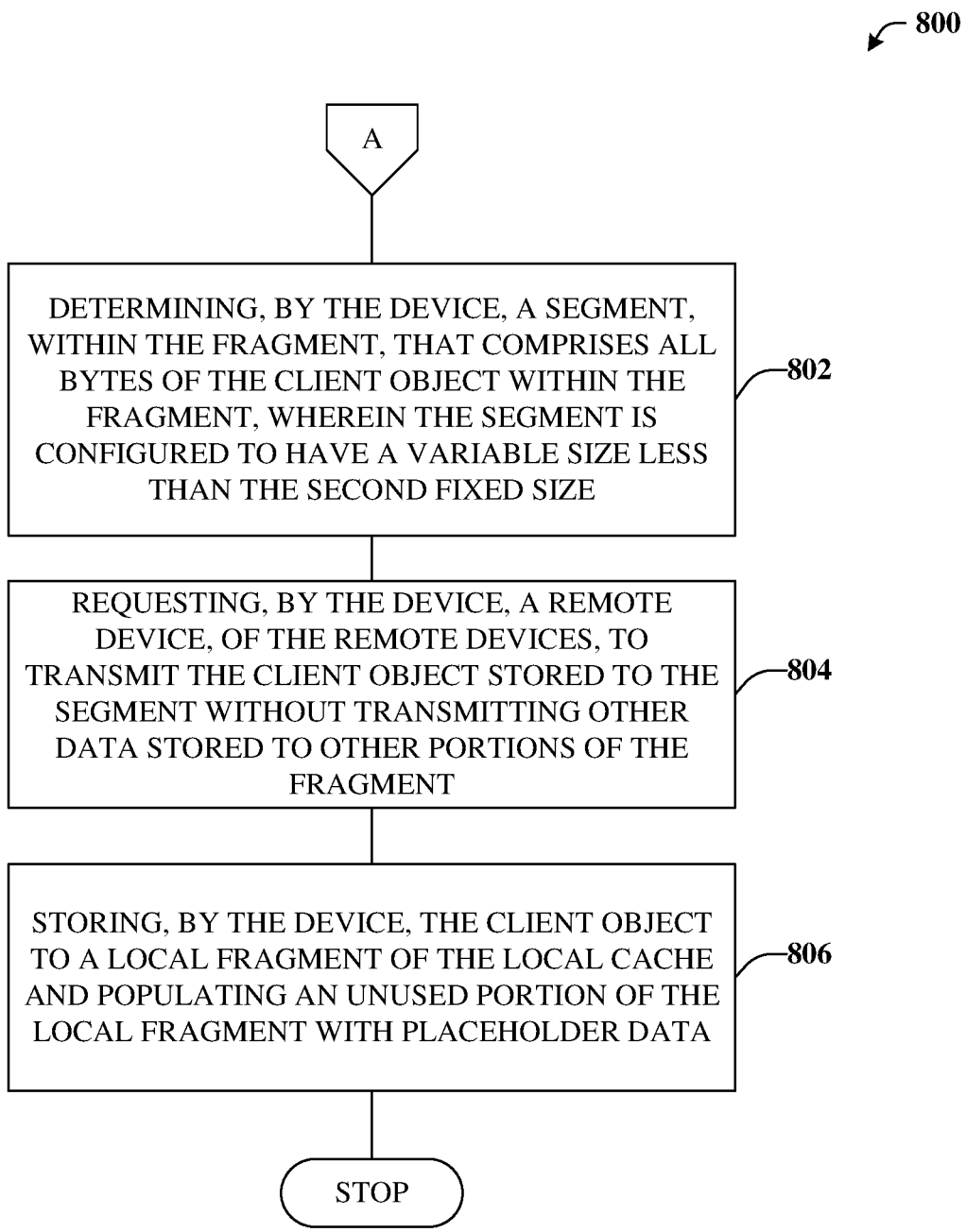
FIG. 8 illustrates an example methodology that can provide for additional elements or aspects in connection with reducing inter-zone transfers or increasing local cache efficiency of an ECS system in accordance with certain embodiments of this disclosure.

FIGS. 7 and 8 illustrate various methodologies in accordance with the disclosed subject matter. While, for purposes of simplicity of explanation, the methodologies are shown and described as a series of acts, it is to be understood and appreciated that the disclosed subject matter is not limited by the order of acts, as some acts may occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the disclosed subject matter. Additionally, it should be further appreciated that the methodologies disclosed hereinafter and throughout this specification are capable of being stored on an article of manufacture to facilitate transporting and transferring such methodologies to computers.

Turning now to FIG. 7, exemplary method 700 is depicted. Method 700 can facilitate reduced inter-zone transfers and increased local cache efficiency of an ECS system in accordance with certain embodiments of this disclosure. For example, at reference numeral 702, a device comprising a processor can receive a request for a client object from a client device. The request can be in connection with a read operation or another suitable operation with respect to the client object and/or in connection with any suitable service provided to the client by the ECS system.

At reference numeral 704, the device can determine the client object is stored in a chunk at a group of remote storage devices of an ECS system. The ECS system can store client objects in chunks of a first fixed size and can protect the client objects via an erasure coding procedure performed at the chunk level. It is appreciated that the group of remote storage devices can represent storage devices of remote zones that can store remote data to first chunks of the first fixed size.

At reference numeral 706, the device can determine a fragment of the chunk that stores the client object. The fragment can be representative of a data fragment of a second fixed size, less than the first fixed size, employed by the erasure coding procedure. Typically, a chunk can be divided into some number, k, fragments, and thus, the second fixed size can be 1/k as large as the first fixed size.

Upon request to the remote storage devices of fragment data contained in the identified fragment, at reference numeral 708, the device can store the fragment data to a local cache of a local storage device of the ECS system. The local storage device can be configured to store local data to second chunks of the first fixed size and can comprise the local cache configured to store a copy of a portion of the remote data. It is understood that by requesting and storing data of the second fixed size (e.g., fragment size) rather than the first fixed size (e.g., chunk size), inter-zone transfers and remote data caching can be significantly more efficient. As depicted, method 700 can proceed to insert A, which is further detailed in connection with FIG. 8, or stop.

With reference now to FIG. 8, exemplary method 800 is illustrated. Method 800 can provide for additional elements or aspects in connection with reducing inter-zone transfers or increasing local cache efficiency of an ECS system in accordance with certain embodiments of this disclosure. For example, at reference numeral 802, the device can determine a segment, within the fragment, that comprises all bytes of the client object within the fragment. It is understood that the segment can be configured to have a variable size less than the second fixed size. That is, the size of any portion of the client object (e.g., the segment) contained in a given fragment is less than or equal to the size of the fragment, which is the second fixed size.

At reference numeral 804, the device can request a remote device, of the remote devices, to transmit the client object stored to the segment without transmitting other data stored to other portions of the fragment. In other words, rather than requesting the entire fragment, only the arbitrary sized segment is requested. Since the size of the segment is guaranteed to be significantly less than the size of a chunk and less than or equal to the size of a fragment, and typically significantly less than the size of a fragment, such can further reduce the size of data exchanged in connection with inter-zone transfers.

At reference numeral 806, the device can store the client object (e.g., the requested segment) to a local fragment of the local cache. The device can further populate an unused portion of the local fragment with placeholder data.

Example Operating Environments

Figure 9:
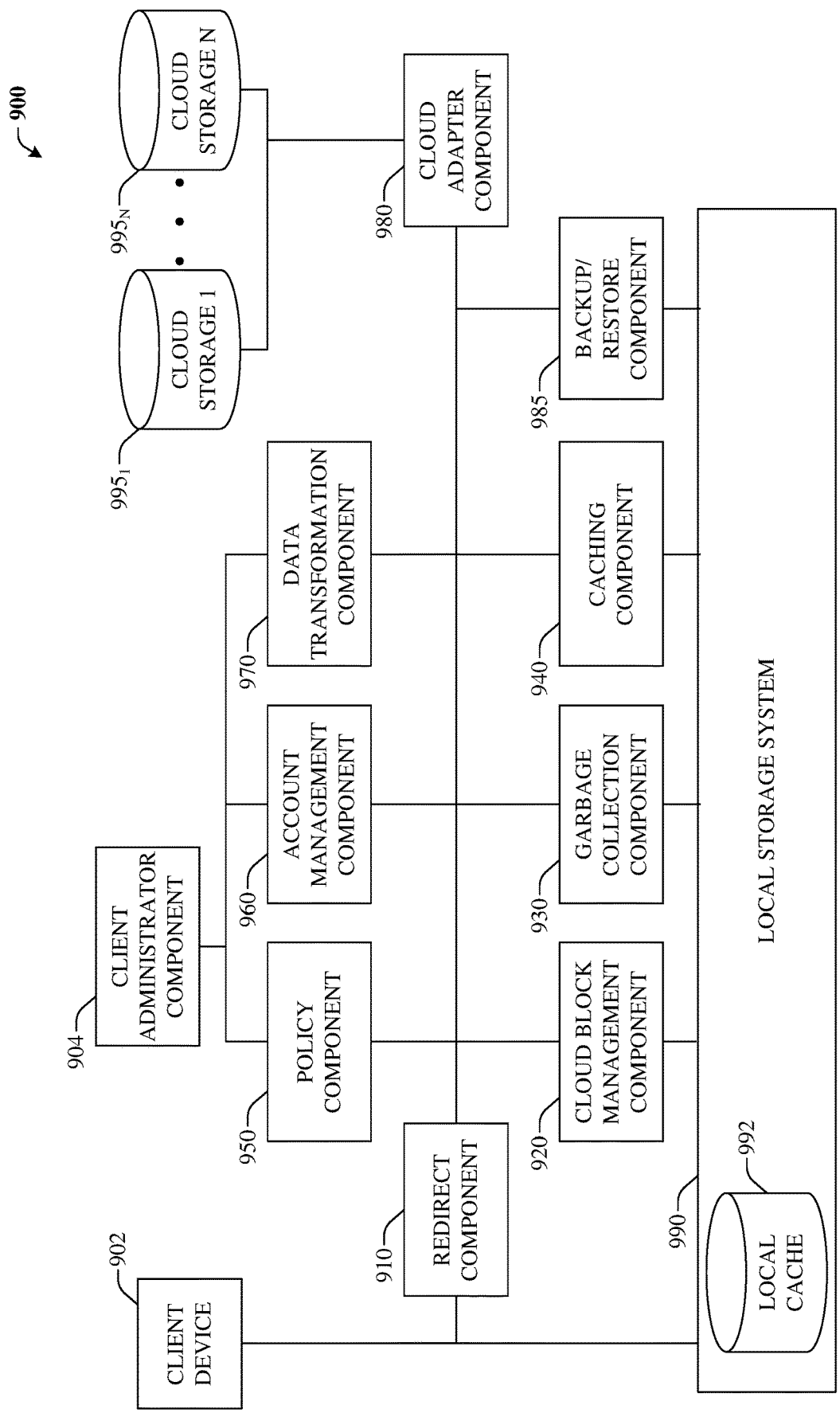
FIG. 9 illustrates a block diagram of an example distributed file storage system that employs tiered cloud storage in accordance with certain embodiments of this disclosure.
Figure 10:
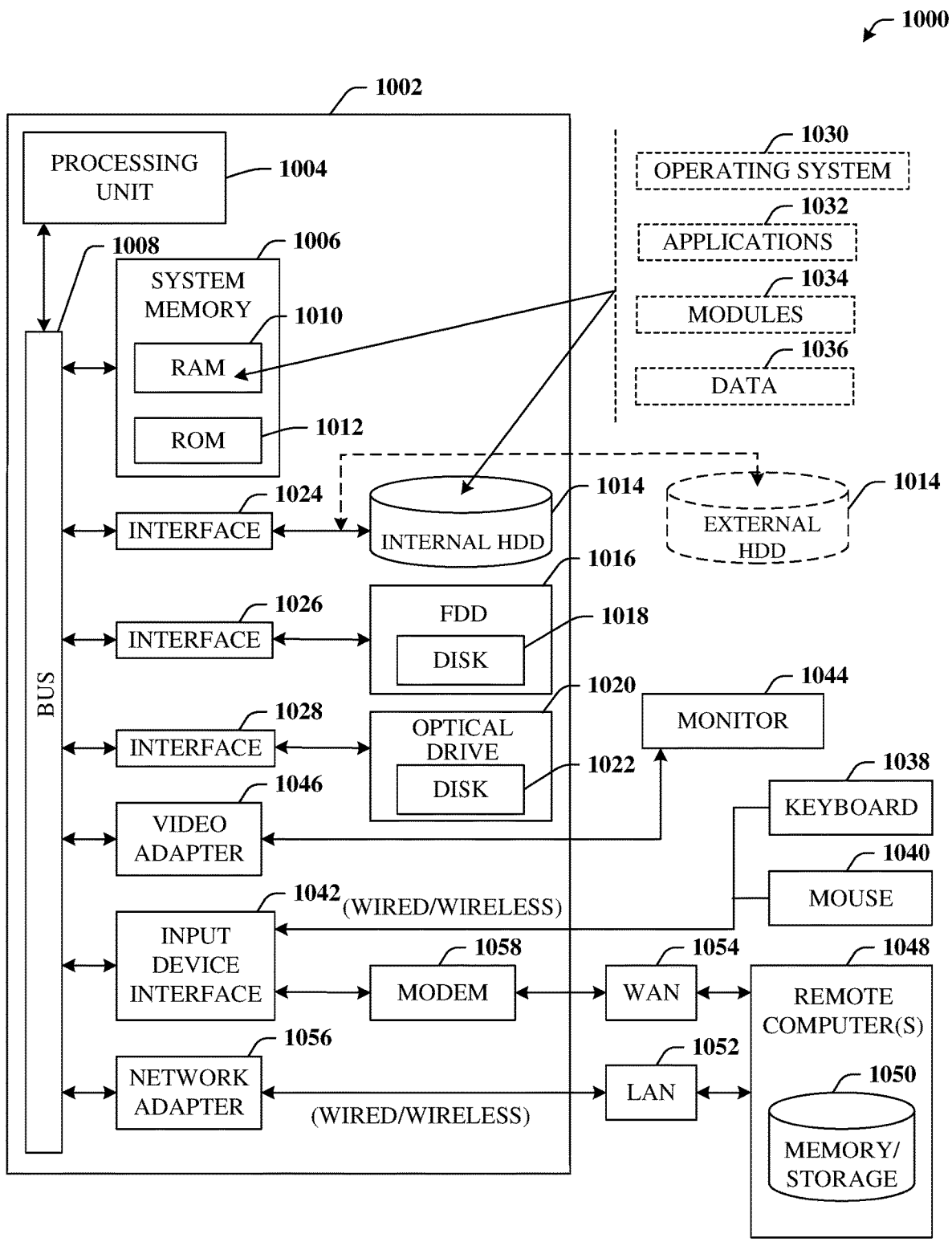
FIG. 10 illustrates an example block diagram of a computer operable to execute certain embodiments of this disclosure.

To provide further context for various aspects of the subject specification, FIGS. 9 and 10 illustrate, respectively, a block diagram of an example distributed file storage system 900 that employs tiered cloud storage and block diagram of a computer 1002 operable to execute the disclosed storage architecture in accordance with aspects described herein.

Referring now to FIG. 9, there is illustrated an example local storage system including cloud tiering components and a cloud storage location in accordance with implementations of this disclosure. Client device 902 can access local storage system 990. Local storage system 990 can be a node and cluster storage system such as an EMC Isilon Cluster that operates under OneFS operating system. Local storage system 990 can also store the local cache 992 for access by other components. It can be appreciated that the systems and methods described herein can run in tandem with other local storage systems as well.

As more fully described below with respect to redirect component 910, redirect component 910 can intercept operations directed to stub files. Cloud block management component 920, garbage collection component 930, and caching component 940 may also be in communication with local storage system 990 directly as depicted in FIG. 9 or through redirect component 910. A client administrator component 904 may use an interface to access the policy component 950 and the account management component 960 for operations as more fully described below with respect to these components. Data transformation component 970 can operate to provide encryption and compression to files tiered to cloud storage. Cloud adapter component 980 can be in communication with cloud storage 1 and cloud storage N, where N is a positive integer. It can be appreciated that multiple cloud storage locations can be used for storage including multiple accounts within a single cloud storage location as more fully described in implementations of this disclosure. Further, a backup/restore component 997 can be utilized to back up the files stored within the local storage system 990.

Cloud block management component 920 manages the mapping between stub files and cloud objects, the allocation of cloud objects for stubbing, and locating cloud objects for recall and/or reads and writes. It can be appreciated that as file content data is moved to cloud storage, metadata relating to the file, for example, the complete Mode and extended attributes of the file, still are stored locally, as a stub. In one implementation, metadata relating to the file can also be stored in cloud storage for use, for example, in a disaster recovery scenario.

Mapping between a stub file and a set of cloud objects models the link between a local file (e.g., a file location, offset, range, etc.) and a set of cloud objects where individual cloud objects can be defined by at least an account, a container, and an object identifier. The mapping information (e.g., mapinfo) can be stored as an extended attribute directly in the file. It can be appreciated that in some operating system environments, the extended attribute field can have size limitations. For example, in one implementation, the extended attribute for a file is 8 kilobytes. In one implementation, when the mapping information grows larger than the extended attribute field provides, overflow mapping information can be stored in a separate system b-tree. For example, when a stub file is modified in different parts of the file, and the changes are written back in different times, the mapping associated with the file may grow. It can be appreciated that having to reference a set of non-sequential cloud objects that have individual mapping information rather than referencing a set of sequential cloud objects, can increase the size of the mapping information stored. In one implementation, the use of the overflow system b-tree can limit the use of the overflow to large stub files that are modified in different regions of the file.

File content can be mapped by the cloud block management component 920 in chunks of data. A uniform chunk size can be selected where all files that tiered to cloud storage can be broken down into chunks and stored as individual cloud objects per chunk. It can be appreciated that a large chunk size can reduce the number of objects used to represent a file in cloud storage; however, a large chunk size can decrease the performance of random writes.

The account management component 960 manages the information for cloud storage accounts. Account information can be populated manually via a user interface provided to a user or administer of the system. Each account can be associated with account details such as an account name, a cloud storage provider, a uniform resource locator ("URL"), an access key, a creation date, statistics associated with usage of the account, an account capacity, and an amount of available capacity. Statistics associated with usage of the account can be updated by the cloud block management component 920 based on list of mappings it manages. For example, each stub can be associated with an account, and the cloud block management component 920 can aggregate information from a set of stubs associated with the same account. Other example statistics that can be maintained include the number of recalls, the number of writes, the number of modifications, the largest recall by read and write operations, etc. In one implementation, multiple accounts can exist for a single cloud service provider, each with unique account names and access codes.

The cloud adapter component 980 manages the sending and receiving of data to and from the cloud service providers. The cloud adapter component 980 can utilize a set of APIs. For example, each cloud service provider may have provider specific API to interact with the provider.

A policy component 950 enables a set of policies that aid a user of the system to identify files eligible for being tiered to cloud storage. A policy can use criteria such as file name, file path, file size, file attributes including user generated file attributes, last modified time, last access time, last status change, and file ownership. It can be appreciated that other file attributes not given as examples can be used to establish tiering policies, including custom attributes specifically designed for such purpose. In one implementation, a policy can be established based on a file being greater than a file size threshold and the last access time being greater than a time threshold.

In one implementation, a policy can specify the following criteria: stubbing criteria, cloud account priorities, encryption options, compression options, caching and IO access pattern recognition, and retention settings. For example, user selected retention policies can be honored by garbage collection component 930. In another example, caching policies such as those that direct the amount of data cached for a stub (e.g., full vs. partial cache), a cache expiration period (e.g., a time period where after expiration, data in the cache is no longer valid), a write back settle time (e.g., a time period of delay for further operations on a cache region to guarantee any previous writebacks to cloud storage have settled prior to modifying data in the local cache), a delayed invalidation period (e.g., a time period specifying a delay until a cached region is invalidated thus retaining data for backup or emergency retention), a garbage collection retention period, backup retention periods including short term and long term retention periods, etc.

A garbage collection component 930 can be used to determine which files/objects/data constructs remaining in both local storage and cloud storage can be deleted. In one implementation, the resources to be managed for garbage collection include CMOs, cloud data objects (CDOs) (e.g., a cloud object containing the actual tiered content data), local cache data, and cache state information.

A caching component 940 can be used to facilitate efficient caching of data to help reduce the bandwidth cost of repeated reads and writes to the same portion (e.g., chunk or sub-chunk) of a stubbed file, can increase the performance of the write operation, and can increase performance of read operations to portion of a stubbed file accessed repeatedly. As stated above with regards to the cloud block management component 920, files that are tiered are split into chunks and in some implementations, sub chunks. Thus, a stub file or a secondary data structure can be maintained to store states of each chunk or sub-chunk of a stubbed file. States (e.g., stored in the stub as cacheinfo) can include a cached data state meaning that an exact copy of the data in cloud storage is stored in local cache storage, a non-cached state meaning that the data for a chunk or over a range of chunks and/or sub chunks is not cached and therefore the data has to be obtained from the cloud storage provider, a modified state or dirty state meaning that the data in the range has been modified, but the modified data has not yet been synched to cloud storage, a sync-in-progress state that indicates that the dirty data within the cache is in the process of being synced back to the cloud and a truncated state meaning that the data in the range has been explicitly truncated by a user. In one implementation, a fully cached state can be flagged in the stub associated with the file signifying that all data associated with the stub is present in local storage. This flag can occur outside the cache tracking tree in the stub file (e.g., stored in the stub file as cacheinfo), and can allow, in one example, reads to be directly served locally without looking to the cache tracking tree.

The caching component 940 can be used to perform at least the following seven operations: cache initialization, cache destruction, removing cached data, adding existing file information to the cache, adding new file information to the cache, reading information from the cache, updating existing file information to the cache, and truncating the cache due to a file operation. It can be appreciated that besides the initialization and destruction of the cache, the remaining five operations can be represented by four basic file system operations: Fill, Write, Clear and Sync. For example, removing cached data is represented by clear, adding existing file information to the cache by fill, adding new information to the cache by write, reading information from the cache by read following a fill, updating existing file information to the cache by fill followed by a write, and truncating cache due to file operation by sync and then a partial clear.

In one implementation, the caching component 940 can track any operations performed on the cache. For example, any operation touching the cache can be added to a queue prior to the corresponding operation being performed on the cache. For example, before a fill operation, an entry is placed on an invalidate queue as the file and/or regions of the file will be transitioning from an uncached state to cached state. In another example, before a write operation, an entry is placed on a synchronization list as the file and/or regions of the file will be transitioning from cached to cached-dirty. A flag can be associated with the file and/or regions of the file to show that it has been placed in a queue, and the flag can be cleared upon successfully completing the queue process.

In one implementation, a time stamp can be utilized for an operation along with a custom settle time depending on the operations. The settle time can instruct the system how long to wait before allowing a second operation on a file and/or file region. For example, if the file is written to cache and a write back entry is also received, by using settle times, the write back can be re-queued rather than processed if the operation is attempted to be performed prior to the expiration of the settle time.

In one implementation, a cache tracking file can be generated and associated with a stub file at the time it is tiered to the cloud. The cache tracking file can track locks on the entire file and/or regions of the file and the cache state of regions of the file. In one implementation, the cache tracking file is stored in an Alternate Data Stream ("ADS"). It can be appreciated that ADS are based on the New Technology File System ("NTFS") ADS. In one implementation, the cache tracking tree tracks file regions of the stub file, cached states associated with regions of the stub file, a set of cache flags, a version, a file size, a region size, a data offset, a last region, and a range map.

In one implementation, a cache fill operation can be processed by the following steps: (1) an exclusive lock on can be activated on the cache tracking tree; (2) it can be verified whether the regions to be filled are dirty; (3) the exclusive lock on the cache tracking tree can be downgraded to a shared lock; (4) a shared lock can be activated for the cache region; (5) data can be read from the cloud into the cache region; (6) update the cache state for the cache region to cached; and (7) locks can be released.

In one implementation, a cache read operation can be processed by the following steps: (1) a shared lock on the cache tracking tree can be activated; (2) a shared lock on the cache region for the read can be activated; (3) the cache tacking tree can be used to verify that the cache state for the cache region is not "not cached;" (4) data can be read from the cache region; (5) the shared lock on the cache region can be deactivated; (6) the shared lock on the cache tracking tree can be deactivated.

In one implementation, a cache write operation can be processed by the following steps: (1) an exclusive lock on can be activated on the cache tracking tree; (2) the file can be added to the synch queue; (3) if the file size of the write is greater than the current file size, the cache range for the file can be extended; (4) the exclusive lock on the cache tracking tree can be downgraded to a shared lock; (5) an exclusive lock can be activated on the cache region; (6) if the cache tracking tree marks the cache region as "not cached" the region can be filled; (7) the cache tracking tree can updated to mark the cache region as dirty; (8) the data can be written to the cache region; (9) the lock can be deactivated.

In one implementation, data can be cached at the time of a first read. For example, if the state associated with the data range called for in a read operation is non-cached, then this would be deemed a first read, and the data can be retrieved from the cloud storage provider and stored into local cache. In one implementation, a policy can be established for populating the cache with range of data based on how frequently the data range is read; thus, increasing the likelihood that a read request will be associated with a data range in a cached data state. It can be appreciated that limits on the size of the cache, and the amount of data in the cache can be limiting factors in the amount of data populated in the cache via policy.

A data transformation component 970 can encrypt and/or compress data that is tiered to cloud storage. In relation to encryption, it can be appreciated that when data is stored in off-premises cloud storage and/or public cloud storage, users can require data encryption to ensure data is not disclosed to an illegitimate third party. In one implementation, data can be encrypted locally before storing/writing the data to cloud storage.

In one implementation, the backup/restore component 997 can transfer a copy of the files within the local storage system 990 to another cluster (e.g., target cluster). Further, the backup/restore component 997 can manage synchronization between the local storage system 990 and the other cluster, such that, the other cluster is timely updated with new and/or modified content within the local storage system 990.

Referring now to FIG. 10, there is illustrated a block diagram of a computer 1002 operable to execute the disclosed communication architecture. To provide additional context for various aspects of the disclosed subject matter, FIG. 10 and the following discussion are intended to provide a brief, general description of a suitable computing environment 1000 in which the various aspects of the specification can be implemented. While the specification has been described above in the general context of computer-executable instructions that can run on one or more computers, those skilled in the art will recognize that the specification also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices. The illustrated aspects of the specification can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media and/or communications media, which two terms are used herein differently from one another as follows. Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, radio frequency (RF), infrared and other wireless media.

With reference again to FIG. 10, the example environment 1000 for implementing various aspects of the specification includes a computer 1002, the computer 1002 including a processing unit 1004, a system memory 1006 and a system bus 1008. As an example, the component(s), server(s), node(s), cluster(s), system(s), and/or device(s) disclosed herein can each include at least a portion of the computer 1002. The system bus 1008 couples system components including, but not limited to, the system memory 1006 to the processing unit 1004. The processing unit 1004 can be any of various commercially available processors. Dual microprocessors and other multi-processor architectures can also be employed as the processing unit 1004.

The system bus 1008 can be any of several types of bus structure that can further interconnect to a memory bus (with or without a memory controller), a peripheral bus, and a local bus using any of a variety of commercially available bus architectures. The system memory 1006 includes read-only memory (ROM) 1010 and random-access memory (RAM) 1012. A basic input/output system (BIOS) is stored in a non-volatile memory 1010 such as ROM, EPROM, EEPROM, which BIOS contains the basic routines that help to transfer information between elements within the computer 1002, such as during startup. The RAM 1012 can also include a high-speed RAM such as static RAM for caching data.

The computer 1002 further includes an internal hard disk drive (HDD) 1014, which internal hard disk drive 1014 can also be configured for external use in a suitable chassis (not shown), a magnetic floppy disk drive (FDD) 1016, (e.g., to read from or write to a removable diskette 1018) and an optical disk drive 1020, (e.g., reading a CD-ROM disk 1022 or, to read from or write to other high capacity optical media such as the DVD). The hard disk drive 1014, magnetic disk drive 1016 and optical disk drive 1020 can be connected to the system bus 1008 by a hard disk drive interface 1024, a magnetic disk drive interface 1026 and an optical drive interface 1028, respectively. The interface 1024 for external drive implementations includes at least one or both of Universal Serial Bus (USB) and IEEE 1394 interface technologies. Other external drive connection technologies are within contemplation of the subject disclosure.

The drives and their associated computer-readable storage media provide nonvolatile storage of data, data structures, computer-executable instructions, and so forth. For the computer 1002, the drives and storage media accommodate the storage of any data in a suitable digital format. Although the description of computer-readable storage media above refers to a HDD, a removable magnetic diskette, and a removable optical media such as a CD or DVD, it should be appreciated by those skilled in the art that other types of storage media which are readable by a computer, such as zip drives, magnetic cassettes, flash memory cards, cartridges, and the like, can also be used in the example operating environment, and further, that any such storage media can contain computer-executable instructions for performing the methods of the specification.

Many program modules can be stored in the drives and RAM 1012, including an operating system 1030, one or more application programs 1032, other program modules 1034 and program data 1036. All or portions of the operating system, applications, modules, and/or data can also be cached in the RAM 1012. It is appreciated that the specification can be implemented with various commercially available operating systems or combinations of operating systems.

A user can enter commands and information into the computer 1002 through one or more wired/wireless input devices, e.g., a keyboard 1038 and/or a pointing device, such as a mouse 1040 or a touch screen or touchpad (not illustrated). These and other input devices are often connected to the processing unit 1004 through an input device interface 1042 that is coupled to the system bus 1008, but can be connected by other interfaces, such as a parallel port, an IEEE 1394 serial port, a game port, a USB port, an infrared (IR) interface, etc. A monitor 1044 or other type of display device is also connected to the system bus 1008 via an interface, such as a video adapter 1046.

The computer 1002 can operate in a networked environment using logical connections via wired and/or wireless communications to one or more remote computers, such as a remote computer(s) 1048. The remote computer(s) 1048 can be a workstation, a server computer, a router, a personal computer, portable computer, microprocessor-based entertainment appliance, a peer device or other common network node, and typically includes many or all the elements described relative to the computer 1002, although, for purposes of brevity, only a memory/storage device 1050 is illustrated. The logical connections depicted include wired/wireless connectivity to a local area network (LAN) 1052 and/or larger networks, e.g., a wide area network (WAN) 1054. Such LAN and WAN networking environments are commonplace in offices and companies, and facilitate enterprise-wide computer networks, such as intranets, all of which can connect to a global communications network, e.g., the Internet.

When used in a LAN networking environment, the computer 1002 is connected to the local network 1052 through a wired and/or wireless communication network interface or adapter 1056. The adapter 1056 can facilitate wired or wireless communication to the LAN 1052, which can also include a wireless access point disposed thereon for communicating with the wireless adapter 1056.

When used in a WAN networking environment, the computer 1002 can include a modem 1058, or is connected to a communications server on the WAN 1054, or has other means for establishing communications over the WAN 1054, such as by way of the Internet. The modem 1058, which can be internal or external and a wired or wireless device, is connected to the system bus 1008 via the serial port interface 1042. In a networked environment, program modules depicted relative to the computer 1002, or portions thereof, can be stored in the remote memory/storage device 1050. It will be appreciated that the network connections shown are example and other means of establishing a communications link between the computers can be used.

The computer 1002 is operable to communicate with any wireless devices or entities operatively disposed in wireless communication, e.g., desktop and/or portable computer, server, communications satellite, etc. This includes at least Wi-Fi and Bluetooth® wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 1002.11 (a, b, g, n, etc.) to provide secure, reliable, fast wireless connectivity. A Wi-Fi network can be used to connect computers to each other, to the Internet, and to wired networks (which use IEEE802.3 or Ethernet). Wi-Fi networks operate in the unlicensed 5 GHz radio band at a 54 Mbps (802.11a) data rate, and/or a 2.4 GHz radio band at an 11 Mbps (802.11b), a 54 Mbps (802.11g) data rate, or up to a 600 Mbps (802.11n) data rate for example, or with products that contain both bands (dual band), so the networks can provide real-world performance similar to the basic "10BaseT" wired Ethernet networks used in many offices.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory in a single machine or multiple machines. Additionally, a processor can refer to an integrated circuit, a state machine, an application specific integrated circuit (ASIC), a digital signal processor (DSP), a programmable gate array (PGA) including a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units. One or more processors can be utilized in supporting a virtualized computing environment. The virtualized computing environment may support one or more virtual machines representing computers, servers, or other computing devices. In such virtualized virtual machines, components such as processors and storage devices may be virtualized or logically represented. In an aspect, when a processor executes instructions to perform "operations", this could include the processor performing the operations directly and/or facilitating, directing, or cooperating with another device or component to perform the operations.

In the subject specification, terms such as "data store," data storage," "database," "cache," and substantially any other information storage component relevant to operation and functionality of a component, refer to "memory components," or entities embodied in a "memory" or components comprising the memory. It will be appreciated that the memory components, or computer-readable storage media, described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

The illustrated aspects of the disclosure can be practiced in distributed computing environments where certain tasks are performed by remote processing devices that are linked through a communications network. In a distributed computing environment, program modules can be located in both local and remote memory storage devices.

The systems and processes described above can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders that are not all of which may be explicitly illustrated herein.

As used in this application, the terms "component," "module," "system," "interface," "cluster," "server," "node," or the like are generally intended to refer to a computer-related entity, either hardware, a combination of hardware and software, software, or software in execution or an entity related to an operational machine with one or more specific functionalities. For example, a component can be, but is not limited to being, a process running on a processor, a processor, an object, an executable, a thread of execution, computer-executable instruction(s), a program, and/or a computer. By way of illustration, both an application running on a controller and the controller can be a component. One or more components may reside within a process and/or thread of execution and a component may be localized on one computer and/or distributed between two or more computers. As another example, an interface can include input/output (I/O) components as well as associated processor, application, and/or API components.

Further, the various embodiments can be implemented as a method, apparatus, or article of manufacture using standard programming and/or engineering techniques to produce software, firmware, hardware, or any combination thereof to control a computer to implement one or more aspects of the disclosed subject matter. An article of manufacture can encompass a computer program accessible from any computer-readable device or computer-readable storage/communications media. For example, computer readable storage media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Of course, those skilled in the art will recognize many modifications can be made to this configuration without departing from the scope or spirit of the various embodiments.

In addition, the word "example" or "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes examples of the present specification. It is, of course, not possible to describe every conceivable combination of components or methods for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
a memory that stores computer executable components; and
a processor that executes computer executable components stored in the memory, wherein the computer executable components comprise:
a remote interface component that interfaces with a group of remote storage devices of an elastic cloud storage (ECS) system that stores a client object in a chunk of a first fixed size and protects the client object via an erasure coding procedure performed on the chunk, wherein the group of remote storage devices store remote data to first chunks of the first fixed size;
a local interface component that interfaces with a local storage device of the ECS system, wherein the local storage device stores local data to second chunks of the first fixed size and comprises a local cache configured to store a portion of the remote data;

a client interface component that receives a request for the client object; and a service component that:
  determines the chunk that stores the client object is one of the first chunks that store the remote data; and
  determines a fragment of the chunk that stores the client object, wherein the fragment is representative of data fragment of a second fixed size, less than the first fixed size, employed by the erasure coding procedure.

2. The system of claim 1, wherein the service component is configured to request, via the remote interface component, fragment data contained in the fragment.

3. The system of claim 1, wherein the service component is configured to transmit, via the client interface component, a portion of the fragment data containing the client object.

4. The system of claim 1, wherein the service component is configured to store, via the local interface component, the fragment data to the local cache.

5. The system of claim 1, wherein the service component is configured to determine multiple fragments of the chunk that stores the client object.

6. The system of claim 1, wherein the service component determines the fragment based on a determination of an index of the fragment within the chunk, wherein the index is determined as a function of:
  a byte offset within the chunk of a byte of the client object,
  the first fixed size, and
  a count of fragments in the chunk.

7. The system of claim 6, wherein the computer executable components further comprise an erasure coding component that performs the erasure coding procedure with respect to the local data.

8. The system of claim 7, wherein the erasure coding procedure performed with respect to the local data comprises logically dividing a local chunk of the first fixed size into first fragments of the second fixed size, and generating redundancy data representative of erasure coding of data stored in the local chunk, and wherein the redundancy data has a size of a defined number of fragments of the second fixed size.

9. The system of claim 1, wherein the computer executable components further comprise a data replication component that exchanges, with the group of remote storage devices, portions of the local data and the remote data in chunks having the first fixed size.

10. The system of claim 1, wherein the computer executable components further comprise a segment component that determines a segment, within the fragment, that comprises all bytes of the client object within the fragment, and wherein the segment is configured to have a variable size less than or equal to the second fixed size.

11. The system of claim 10, wherein the segment component, via the remote interface, requests a remote device, of the remote devices, to transmit the client object stored to the segment without transmitting other data stored to other portions of the fragment.

12. The system of claim 11, wherein the segment component, via the local interface, stores the client object to a local fragment of the local cache and populates an unused portion of the local fragment with placeholder data.

13. A computer-readable storage medium comprising instructions that, in response to execution, cause a device comprising a processor to perform operations, comprising:
  receiving a request for a client object from a client device;
  determining that remote storage devices of an elastic cloud storage (ECS) system stores the client object in a chunk of a first fixed size, wherein the ECS system protects the client object via an erasure coding procedure performed on the chunk, and wherein the remote storage devices store remote data to first chunks of the first fixed size;
  determining a fragment of the chunk that stores the client object, wherein the fragment is representative of a data fragment of a second fixed size, less than the first fixed size, employed by the erasure coding procedure;
  requesting fragment data, comprising the client object, stored to the fragment;
  storing the fragment data to a local cache of a local storage device of the ECS system, wherein the local storage device stores local data to second chunks of the first fixed size and comprises the local cache configured to store a portion of the remote data; and
  transmitting the client object to the client device.

14. The computer-readable storage medium of claim 13, wherein the determining the fragment of the chunk comprises determining an index of the fragment within the chunk, wherein the index is determined as a function of:
  b, representative of a byte offset within the chunk of a byte of the client object;
  S, representative of the first fixed size; and
  k, representative of a count of fragments in the chunk.

15. The computer-readable storage medium of claim 13, wherein the operations further comprise performing the erasure coding procedure with respect to the local data.

16. The computer-readable storage medium of claim 14, wherein the erasure coding procedure performed with respect to the local data comprises logically dividing a local chunk of the first fixed size, S, into k fragments of the second fixed size, and generating redundancy data representative of erasure coding of data stored in the local chunk, wherein the redundancy data has a size of m, where m is a defined number of fragments of the second fixed size.

17. A method, comprising:
  receiving, by a device comprising a processor, a request for a client object from a client device;
  determining, by the device, the client object is stored in a chunk at a group of remote storage devices of an elastic cloud storage (ECS) system stores client objects in chunks of a first fixed size and protect the client objects via an erasure coding procedure performed on the chunks, and wherein the group of remote storage devices store remote data to first chunks of the first fixed size;
  determining, by the device, a fragment of the chunk that stores the client object, wherein the fragment is representative of a coding fragment of a second fixed size, less than the first fixed size, employed by the erasure coding procedure; and
  storing, by the device, the fragment data to a local cache of a local storage device of the ECS system, wherein the local storage device stores local data to second chunks of the first fixed size and comprise the local cache configured to store a portion of the remote data.

18. The method of claim 17, further comprising determining, by the device, a segment, within the fragment, that comprises all bytes of the client object within the fragment, wherein the segment is configured to have a variable size less than the second fixed size.

19. The method of claim 18, further comprising requesting, by the device, a remote device, of the remote devices, to transmit the client object stored to the segment without transmitting other data stored to other portions of the fragment.

20. The method of claim 18, further comprising, storing, by the device, the client object to a local fragment of the local cache and populating an unused portion of the local fragment with placeholder data.

* * * * *